(12) United States Patent
Gudeman et al.

(10) Patent No.: US 9,950,923 B1
(45) Date of Patent: Apr. 24, 2018

(54) METHOD FOR MAKING VIAS USING A DOPED SUBSTRATE

(71) Applicant: Innovative Micro Technology, Goleta, CA (US)

(72) Inventors: Christopher S. Gudeman, Lompoc, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 10 days.

(21) Appl. No.: 15/485,182

(22) Filed: Apr. 11, 2017

(51) Int. Cl.
  *H01L 23/00* (2006.01)
  *B81C 1/00* (2006.01)
  *B81B 3/00* (2006.01)
  *H01L 21/768* (2006.01)
  *H01L 21/762* (2006.01)
  *H01L 23/48* (2006.01)

(52) U.S. Cl.
  CPC ........ *B81C 1/00698* (2013.01); *B81B 3/0086* (2013.01); *H01L 21/76232* (2013.01); *H01L 21/76877* (2013.01); *H01L 21/76879* (2013.01); *H01L 23/481* (2013.01); *B81B 2201/014* (2013.01); *B81B 2207/096* (2013.01); *B81C 2201/0171* (2013.01)

(58) Field of Classification Search
  CPC ............. H01L 21/76232; H01L 23/481; H01L 21/76877; H01L 21/76879
  See application file for complete search history.

(56) References Cited

U.S. PATENT DOCUMENTS

| | | | |
|---|---|---|---|
| 6,562,695 B1 * | 5/2003 | Suzuki | H01L 21/76224 257/296 |
| 2007/0045781 A1 | 3/2007 | Carlson | |
| 2007/0045820 A1 | 3/2007 | Rybnicek | |
| 2007/0048887 A1 | 3/2007 | Erlach et al. | |
| 2007/0096860 A1 | 5/2007 | Foster et al. | |
| 2007/0196998 A1 | 8/2007 | Foster et al. | |
| 2007/0236313 A1 | 10/2007 | Wallis et al. | |
| 2007/0238262 A1 | 10/2007 | Summers | |
| 2010/0264548 A1 * | 10/2010 | Sanders | H01L 21/76898 257/774 |

* cited by examiner

*Primary Examiner* — Ngan Ngo
(74) *Attorney, Agent, or Firm* — Jaquelin K. Spong

(57) ABSTRACT

Described herein is a method and structure for fabricating vias in a semiconductor substrate. The semiconductor substrate is first doped to make it mildly conducting, via holes are formed therein, and a conductive material is deposited in the holes. Using the moderate conductivity of the substrate, the conductive material may be plated into the holes.

10 Claims, 13 Drawing Sheets

METHOD FOR MAKING VIAS USING A DOPED SUBSTRATE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

This invention relates to integrated circuit and microelectromechanical systems (MEMS) devices. More particularly, this invention relates to the formation of vias in wafers on which the integrated circuits and MEMS devices may be fabricated.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to switch electrical signals. Because of its small size and fragile structure, the movable cantilever may be enclosed in a cavity to protect it and to allow its operation in an evacuated environment. Therefore, upon fabrication of the moveable structure on a wafer, (device wafer) the device wafer may be mated with a lid wafer, in which depressions have been formed to allow clearance for the structure and its movement. To maintain the vacuum over the lifetime of the device, a getter material may also be enclosed in the device cavity upon sealing the lid wafer against the device wafer.

In order to control such a microfabricated switch, electrical access must be provided that allows power and signals to be transmitted to and from the switch. Vias are typically formed in at least one of the wafers to provide this access. If the switch is for high frequency signals, it may also be important to design the vias such that their electrical effects on the signals are minimized or at least known and understood.

Accordingly, electrical vias allow electrical access to electronic devices or microelectromechanical systems (MEMS) within a package or in a circuit. In order to continually reduce the cost of such packages and circuits, the packing density of devices within the packages and circuits has been continually increased. In order to support the increase in packing density, the pitch between electrical vias for the devices has also continued to shrink. As a consequence, there is a desire to form vias of increasingly large aspect ratio, that is, the vias are tending to become increasingly long and narrow. Furthermore increased packing density requires that the placement tolerance of the vias be tightly controlled, since increased placement uncertainty requires the center to center separation be increased to avoid inadvertent shorting of adjacent vias.

Some devices use metal traces routed to the device from outside of the package. However, often a metal bonding material is used to bond the lid wafer to the device wafer, such that these metal traces must cross the metal bondline. These metal features, in close proximity, may give rise to large capacitive coupling losses or noise sources.

Long, narrow vias are often created by plating a conductive material into a hole formed in a substrate. A hole may be created in a substrate by a directional material removal process such as reactive ion etching (RIE). A seed layer is then deposited conformally over the etched surface, to provide a conductive layer to attract the plating material from the plating bath.

As the via holes get longer and narrower, it becomes increasingly difficult to form the seed layer and plate uniformly over the hole, and thus filling the hole with conductive material uniformly becomes difficult.

Another known method for making vias is to use an anisotropic etch to form the holes with sloping sidewalls, and to deposit the conductive material on the sloped walls of the holes. However, this method often results in conductive material having non-uniform thickness, and the heat conduction in the thin deposited layer is relatively poor. The aspect ratio must also remain near 1:2 (width=2×depth), further limiting the density of the vias.

Each of these approaches involves the removal of substrate material in the hole to form the via, and the filling of this hole with a conductive material. The hole may be made by, for example, the methods described above and then filled by electroplating gold or copper. Because of the aforementioned problems with these approaches, such methods generally limit the aspect ratio of the via formed, and are also applicable only to conductive substrates.

Therefore, a need exists for a methodology which can form vias with high aspect ratio, and in a relatively insulating or semiconducting substrate such as silicon.

Accordingly, microfabricated, high aspect ratio through substrate electrical via structures have posed an unresolved problem that prior art methods have been unable to adequately address.

SUMMARY

We describe here a method for forming high aspect ratio vias in a semiconductor substrate.

The process may begin by forming holes, either blind holes or through holes, into a semiconductor substrate. The substrate with the holes in then doped, such that the dopant is deposited in the walls of the vias holes, rendering them conductive.

The substrate may be doped to make the substrate nominally conductive. The doped substrate may have a resistivity less than about 20 ohm-cm, and more preferably less than about 8 ohm-cm. This resistivity, while too high to conduct high frequency signals successfully, may be sufficient to dissipate the charge built up during a plating process.

The surface layer of the semiconductor substrate may be more highly doped than the bulk, or interior, because of its proximity to the source of the dopant material. Accordingly, the surface layer may be more highly conducting than the bulk. The surface layer may therefore serve in effect as a seed layer for a subsequent plating process. The plating of a conductive material over this surface layer may then proceed. The interior or bulk of the substrate material may remain relatively insulating, and thus the vias may remain relatively electrically isolated from one another. In operation, a bias voltage may be applied between the bulk material and the surface layer, such that forward biasing of the pn junction does not occur. In other words, a power supply may be used to apply a DC bias to the conductive material such that the conductive material is reverse-biased with respect to the semiconductor substrate.

Accordingly, a feature of this process is that conductive vias are formed in a relatively insulative surrounding material of the semiconductor substrate. The vias may be formed by plating a conductive material such as nickel or copper onto the conductive outer layer of the doped substrate. These vias may supply power and signals to/from the component inside a hermetically sealed device cavity. The signal and/or power may be delivered to the sealed device cavity with these through substrate vias (TSVs). The TSVs may have a bonding pad on one side of the substrate, and a conductive line leading to the device within the device cavity. Accordingly, this architecture avoids the large capacitive losses that may occur with the under-bond routing of these electrical leads.

The encapsulated components may include integrated circuits (ICs) or MEMS devices, such as turning mirrors, optical elements, electrical switches, sensors and actuators for example.

Numerous devices can make use of the systems and methods disclosed herein. In particular, high speed, compact telephone or communications switching equipment may make use of this architecture. RF switches benefit from the reduced capacitive coupling that an insulative substrate can provide. High density vias formed in the insulative substrate increase the density of devices which can be formed on a substrate, thereby reducing cost to manufacture. The performance of such devices may also be improved, in terms of insertion loss, distortion and isolation figures of merit.

These and other features and advantages are described in, or are apparent from, the following detailed description.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

Described herein is a method for inexpensively fabricating high aspect ratio through substrate vias (TSVs) in a semiconductor substrate. The method relies on doping the substrate to a level which allows charge built up by subsequent plating to be dissipated. However, the substrate may still be sufficiently insulating to provide adequate electrical isolation between the vias, depending on the application.

As a result of the method used to dope the semiconductor substrate, the surface layer may be more highly doped than the bulk because of its proximity to the source of the dopant material. Accordingly, the surface layer may be more highly conducting than the bulk. The surface layer may therefore serve in effect as a seed layer for a subsequent plating process. The plating of a conductive material over this surface layer may then proceed. The interior or bulk of the substrate material may remain relatively insulating, and thus the vias may remain relatively electrically isolated from one another. In operation, a bias voltage may be applied between the bulk material and the surface layer, such that forward biasing of the pn junction does not occur.

Several embodiments are described below. The doping may occur by contacting a source of dopant material with the semiconductor wafer in an oven (if necessary) or by bombarding a dopant target in a sputtering chamber, for example. The through vias may be made using blind holes or through holes, and these holes may be formed prior to doping.

Figure 1:
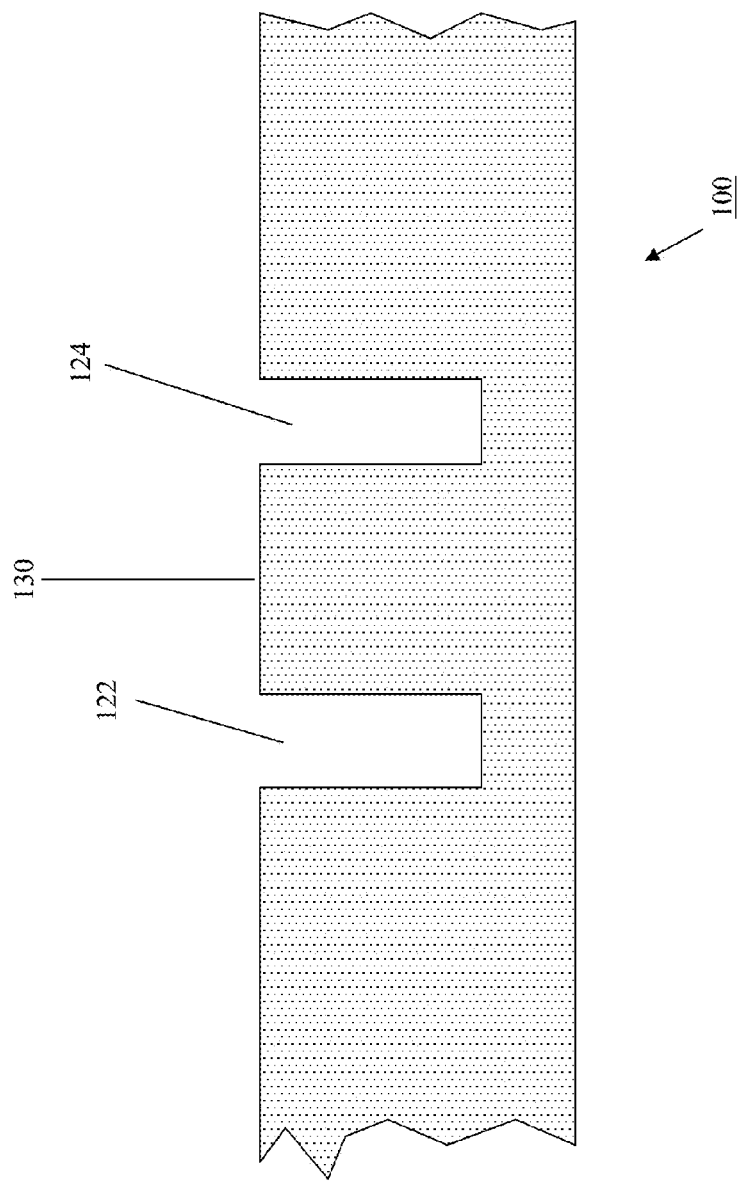
FIG. 1 is a schematic cross sectional diagram of a first step of forming a blind hole in the doped substrate.

The following discussion presents a plurality of exemplary embodiments of the novel TSV method. The following reference numbers are used in the accompanying figures, to refer to the following structures:
2 semiconductor substrate
3 dopant substrate
4 furnace
30 target
40 Sputtering source
100 TSV substrate
122, 124 via holes
130 land area
160 dopant conductive layer
162, 164 plated conductive material
180 over plated conductive material
170 etch/grind line
190 residual substrate material
200 doped semiconductor substrate
222, 224 via holes
230 land area
260 dopant conductive layer
262, 264 plated conductive material
300 cantilever
312, 314 upper pads
322, 324 external pads
122, 124, 222, 224, 322, 324 TSVs
400 bonding material
500 lid substrate
1000 packaged MEMS device FIG. 1 is a schematic cross sectional diagram of a first step, wherein a plurality of blind holes is formed in a semiconducting substrate. As shown in FIG. 1, two blind holes, 122 and 124 may be formed in the semiconductor substrate 100. These holes 122, 124 maybe formed by, for example, deep reactive ion etching (DRIE). The formation of holes 122, and 124 may leave a land, 130 between the holes as shown in the figure. The land 130 may be extensive enough that only a tolerable level of leakage or crosstalk arises between the blind holes 122 and 124. The substrate may be a relatively insulating silicon substrate, such as a float zone silicon, and have a resistivity in excess of 1000 ohm-cm.

Figure 2:
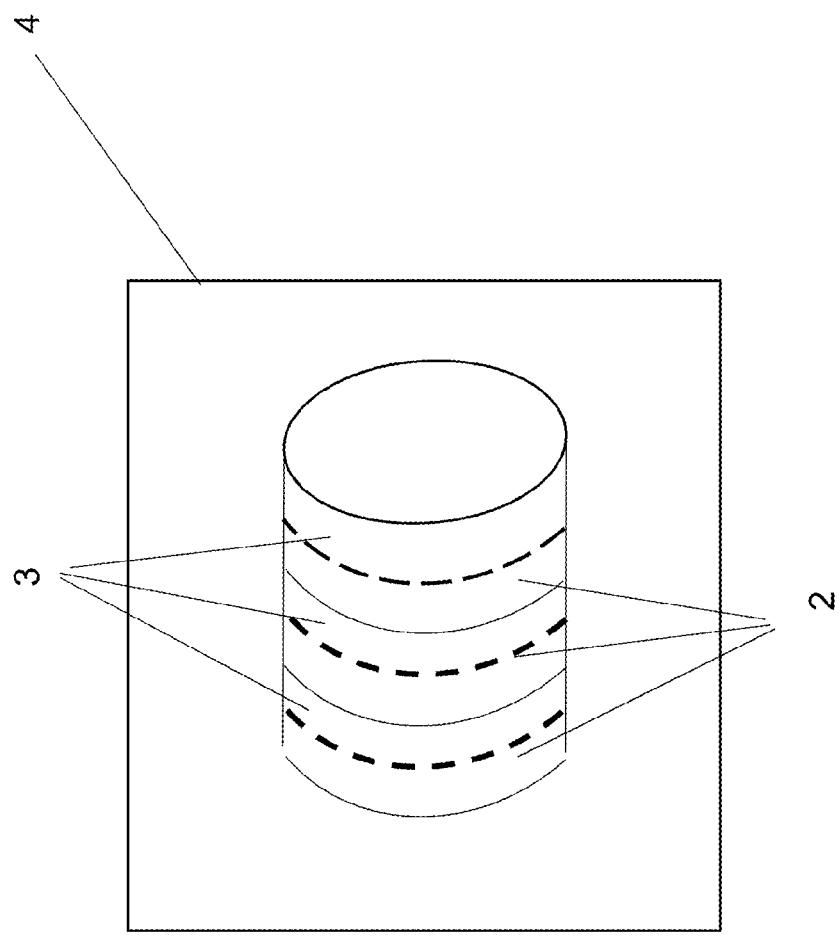
FIG. 2 is a schematic cross sectional diagram of a first exemplary method for doping a substrate.

FIG. 2 shows a first embodiment of a method for doping a semiconductor substrate. As shown in FIG. 1, plurality of substrates maybe interleaved, such that a semiconductor substrate is located directly adjacent to a dopant substrate. In FIG. 2, for example the semiconductor substrates are denoted by reference number 2, and the dopant substrates are noted by reference number 3. The substrates may be stacked adjacent to one another, as shown in the figure, and if necessary, heat may be applied to the stack, in order to volatilize the dopant material 3 and bring it into contact with the semiconductor substrates 2. There is generally a gap between the wafers within the stack. However, the dopant may be volatilized from the dopant wafer at high temperature, and therefore migrate from the dopant substrate 3 to the semiconductor substrate 2.

Accordingly, when the substrates are heated while in close proximity, some amount of the dopant material from the dopant substrate 3 will become associated with, and incorporated in, semiconductor substrates 2. The incorporation of dopant material 3 into a semiconductor substrates 2 may render that semiconductor substrate 2 conductive at a certain level, which depends on the dopant concentration within the semiconductor substrate 3.

Accordingly, the semiconductor substrate 2 may go from being semi conducting to mildly conducting, wherein the mildly conducting portions of this substrate may be on the order of 8 ohm—centimeters. The mildly conducting portions may be primarily in the surface layer, that is, the outer first 1.0-5.0 microns of material. This level of conductivity may be sufficient to dissipate charge built up during an electroplating process. The substrate may nonetheless remain insulating enough to reduce the level of leakage or cross talk, between the through substrate vias formed in the substrates to a tolerable level. Accordingly, this method may be appropriate for low-frequency signals, where in some loss or signal coupling is acceptable.

In order to speed the doping process, the wafers or substrate stacks maybe placed in an oven 4, and heated to a sufficient temperature to drive in the dopant material into the semiconductor substrate. This may render not only the exposed surface portion of the semiconductor substrate conductive, but also the surface layer within the holes 122 and 124 which were formed in the semiconductor substrate. Accordingly, a surface layer 160 may be rendered conductive by the doping, to some depth. Current through the material may be carried primarily in this surface layer 160.

For some applications, simply placing the wafers adjacent to one another optionally applying pressure may be sufficient to dope the substrate to an acceptable level. Otherwise, the stack may be placed in the oven, 4, and the temperature raised to encourage the migration of the dopant material into the semiconductor substrate.

In any case upon withdrawal from the fabrication apparatus, the semiconductor substrate to maybe mildly conductive, as described earlier, and especially in the surface layer.

Another method for semiconductor doping may be to place it in the substrate 100 in a sputtering chamber with a sputtering source 40 and dopant target 30. This sputtering source 40 may emit radiation which impinges on the dopant target 30, dislodging some material from the dopant target 30, which will then land on the semiconductor substrate 100. This may render substrate 100 mildly conductive in the exposed areas.

Figure 3:
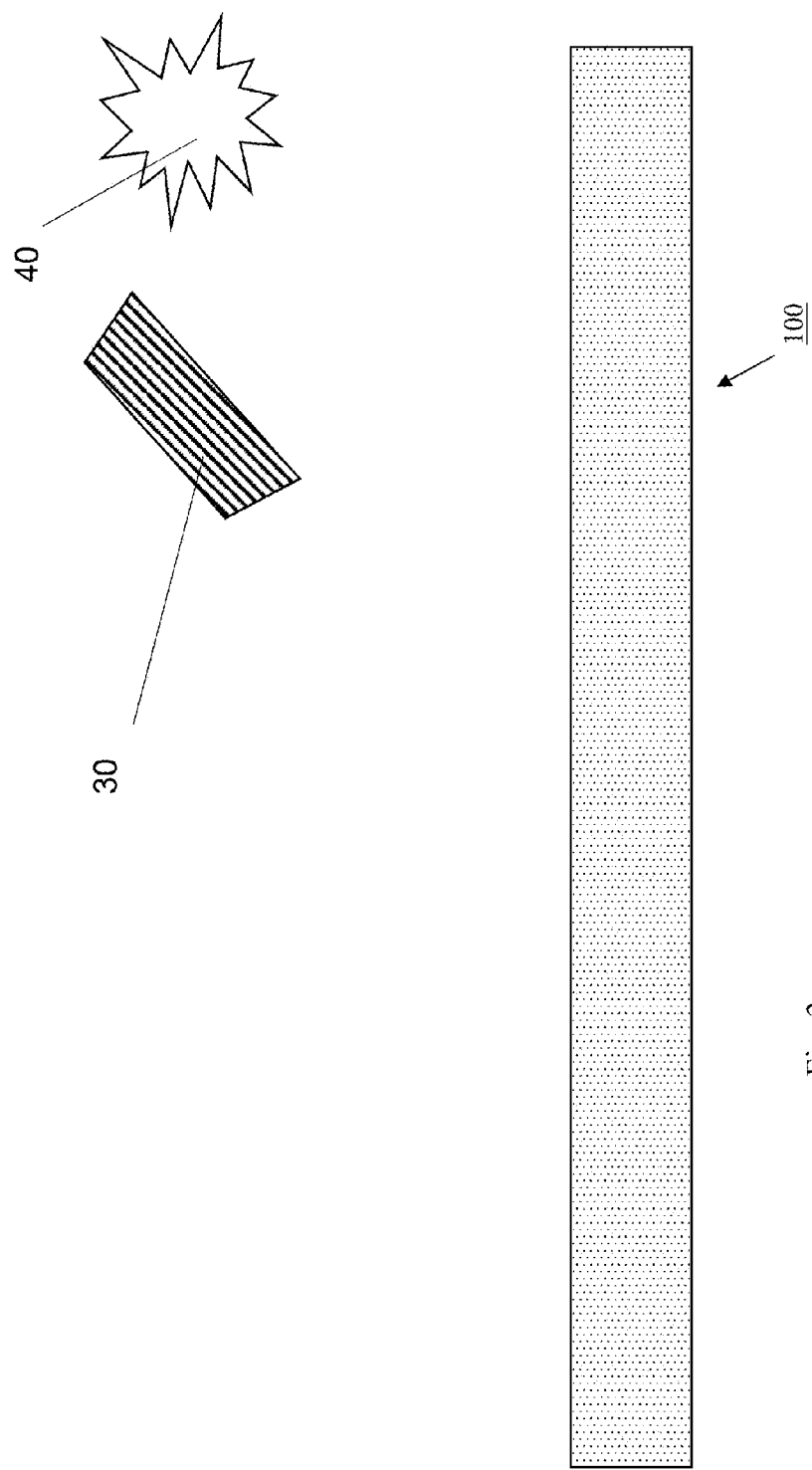
FIG. 3 is a schematic cross sectional diagram of a second exemplary method for doping a substrate.

Alternatively, the dopant may be applied with an ion beam source. Ion implantation typically uses an ion source, where ions of the desired element are produced, an accelerator, where the ions are electrostatically accelerated to a high energy, and a target chamber, where the ions impinge on the target semiconductor substrate, which is the material to be implanted. The ion source may be, for example, boron or phosphorous. Each ion is typically a single atom or molecule, and thus the actual amount of material implanted in the target is the integral over time of the ion current to control the dosage. The currents supplied by implanters are typically small (microamperes), and thus the dose which can be implanted in a reasonable amount of time is small. Therefore, ion implantation finds application in cases where the amount of chemical change required is small. Doping of a semiconductor substrate to raise the conductivity to a workable level may be such an application. This ion beam method of doping is shown schematically in FIG. 3.

Figure 4:
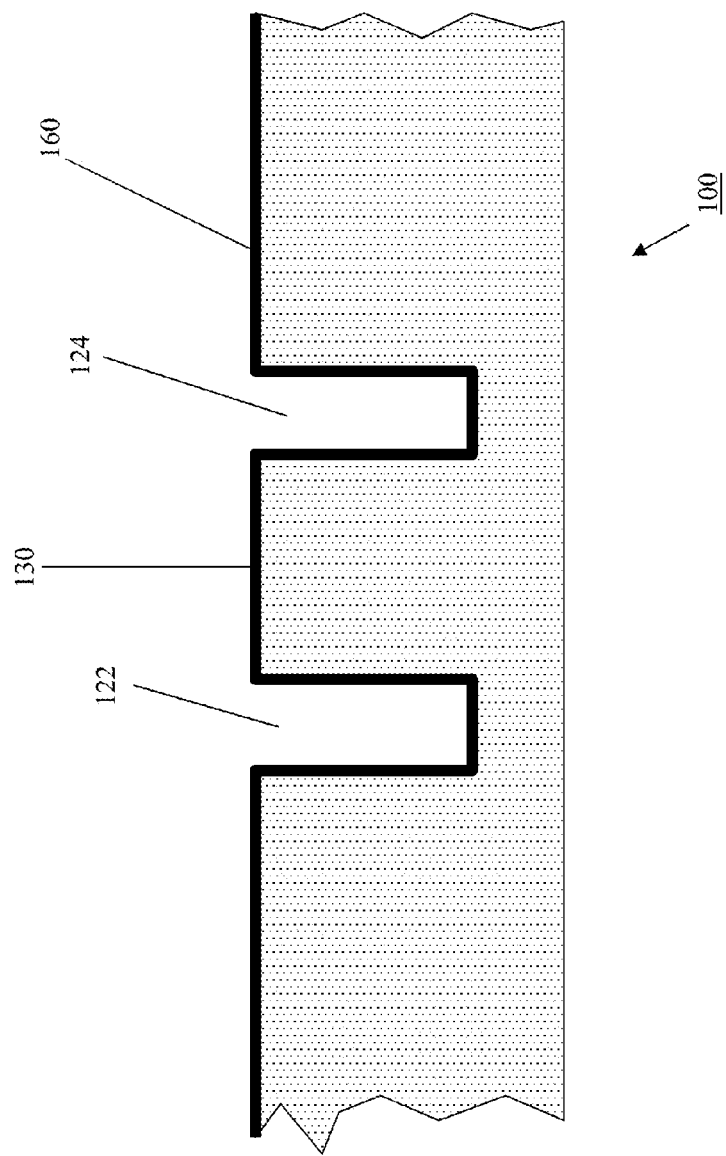
FIG. 4 is a schematic cross sectional diagram of another step in forming the vias in the doped substrate.

As previously mentioned, the doped semiconductor substrate 100 may be rendered conductive, particularly in the outer surface layer 160, such that this outer layer 160 may serve as the seed layer for the plating process to follow. While the surface layer is given a separate reference number 160, it should be understood that the surface layer may be an integral part of the semiconductor substrate 100, that is, the seed layer may only be the surface layer of the semiconductor substrate 100 itself. Accordingly, using the thermal doping process with the stacked wafers may be the preferred process, as the dopant may become incorporated throughout the depth of the hole, such that the conductive layer 160 exists on the sidewalls of the holes 122 and 124 as shown in FIG. 4.

Figure 5:
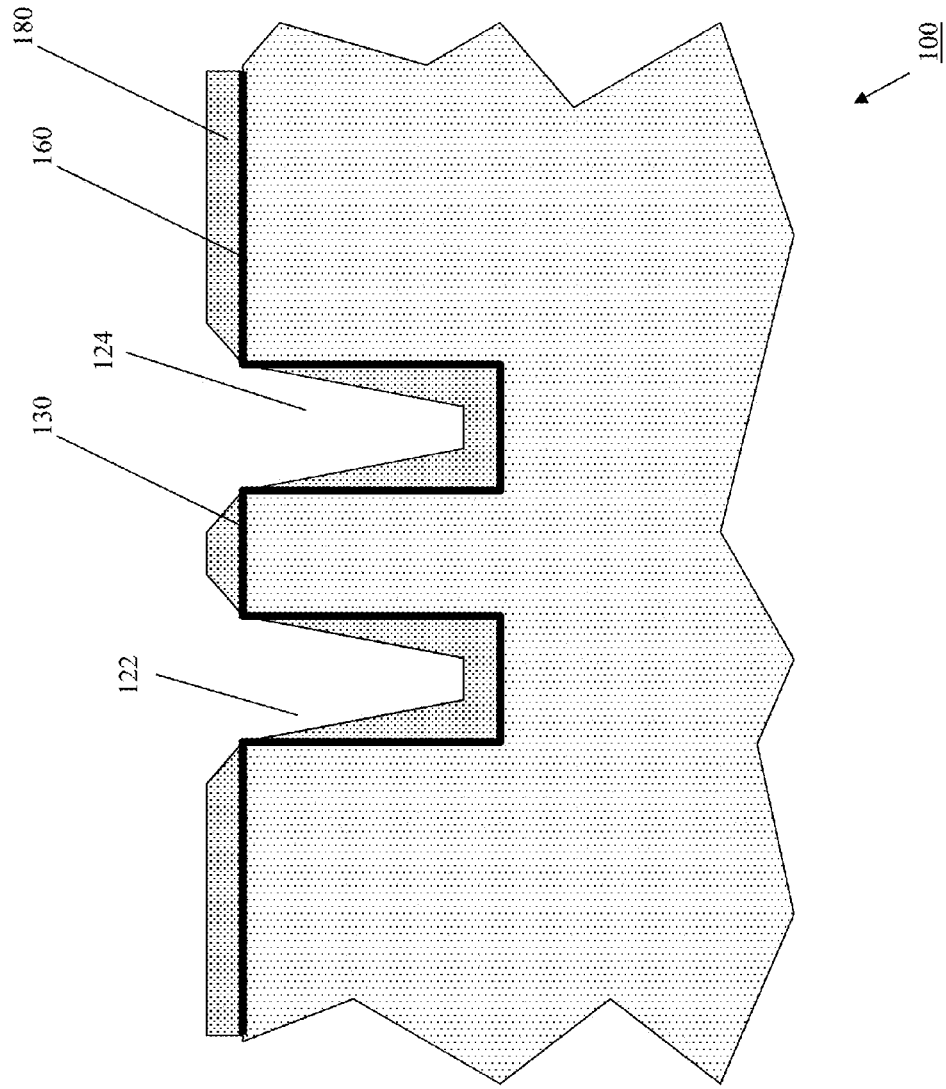
FIG. 5 is a schematic cross sectional diagram of a next step of plating into the blind hole in the doped substrate.

FIG. 5 is a schematic cross sectional diagram of a further step of the process, wherein a conductive material 180 is plated into the blind holes 122 and 124 in the doped substrate. As shown in cross-section of FIG. 5, the doped semiconductor substrate 100 may have a plurality of holes 122 and 124, wherein the surface layer 160 acts as a seed layer for the plating process. Upon providing a voltage potential between the seed layer and an electrode disposed in a plating bath, the operative plating material, that is the ionic species flowing between the electrodes may be deposited on the seed layer 160. Accordingly, during plating, material from the plating bath may be deposited within the blind holes 122, 124. The plated material may be, for example, gold, nickel, copper, or silver, for example.

Alternatively, an electroless plating process may also be used to deposit the conductive material. Electroless plating is a chemical or auto-catalytic plating process, a non-galvanic plating method that involves several simultaneous reactions in an aqueous solution, which occur without the use of external electrical power. It is mainly different from electroplating by not using external electrical power.

Figure 6:
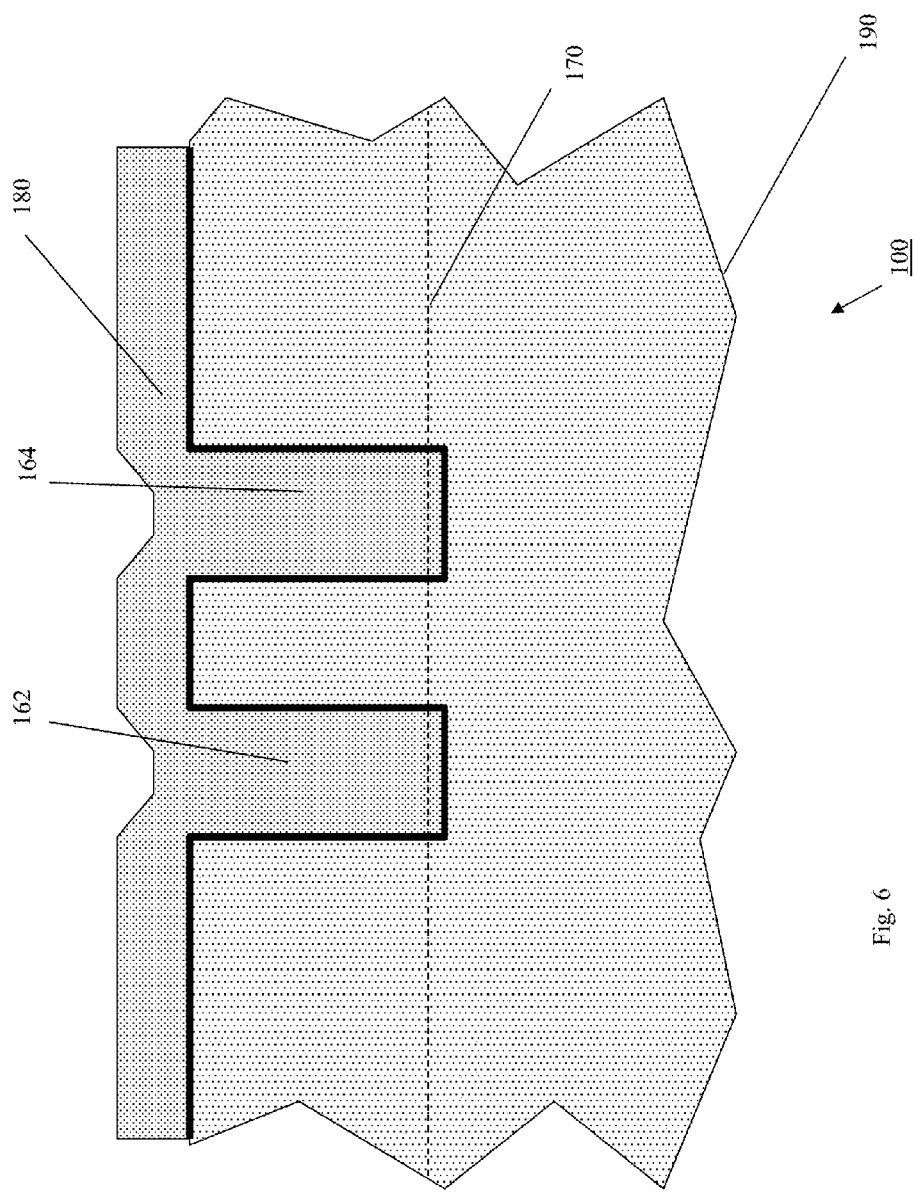
FIG. 6 is a schematic cross sectional diagram of a next step of removing the backside of the substrate to form the via.

As shown in the a cross-sectional diagram of FIG. 6, the plating may continue until the via holes 122 and 124 are completely filled with the conductive material 162, 164 of the plating species. The plating may continue until the material 180 is overplated and extends beyond the surface of semiconductor substrate 100. This excess material maybe ground off by using for example chemical mechanical polishing (CMP). CMP may remove the excess material 180, leaving the surface flush. In a final step, the backside 190 of the semiconductor substrate 100 may be removed to the level 170 as shown in FIG. 6. This material removal may done by etching, grinding, dissolving or sawing away the excess material 180, as described further below.

Figure 7:
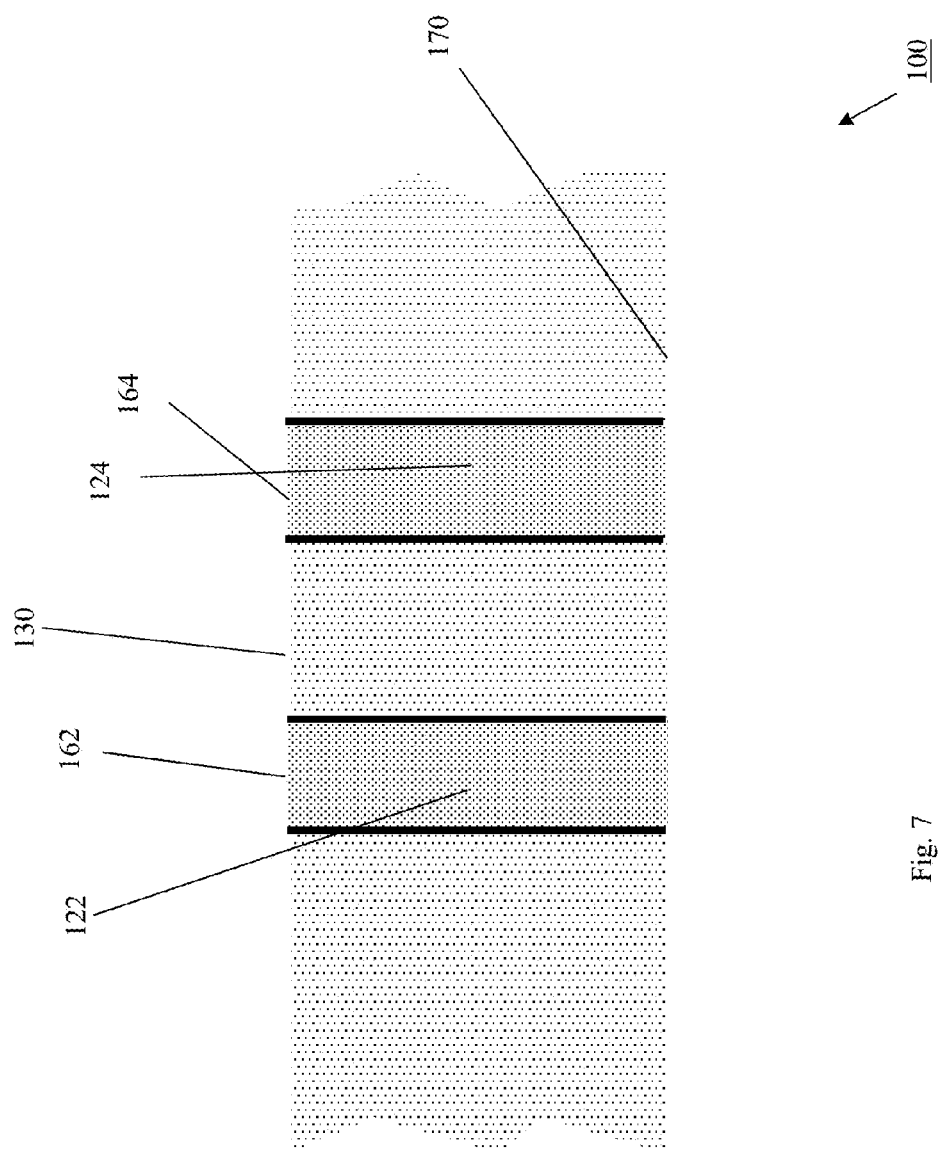
FIG. 7 is a schematic cross sectional diagram of the finished substrate with through substrate vias.

FIG. 7 shows via substrate 100 upon completion of the fabrication steps for the through wafer vias 122 and 124, after planarization of the top surface 180 and the grinding of the back side surface 190 to the point 170. The through wafer vias 122 and 124 may be completed by polishing the top surface 180 to a point at which the surface layer structure 160 and excess material 180 has been removed from the top surface of substrate 100, and the bottom surface 190 has been backgrounded to remove material up to and including the blind walls at boundary 170. Accordingly, the conductive material 163, 164 remains only in the holes 122 and 124.

The material may be removed by, for example, isotropic dry etching, single-sided wet etching or grinding, lapping, and polishing the back side 190 of the substrate 100, to remove material from the back side to a point 170 at which the dead end walls have been removed. In one embodiment, the means for removing material from the back side 190 of the substrate 100 may be a precision wafer grinder, such as a model VG-401 available from Okamoto of Japan. The grinder may use a metal wheel with diamond grit embedded in it as an abrasive. The rotation rate of the grinding wheel may be about 800 rpm, and the rotation rate of the table holding the substrate 100 may be about 80 rpm. Using these parameters, the grinding tool may be programmed to remove material at a rate of about 25 µm per minute for about 15 minutes, to remove about 400 µm to about 450 µm of material, leaving the through wafer via substrate 100 having a thickness of about 50 µm to about 100 µm. At this point, the blind trenches 122 and 124 may become the through wafer vias 162 and 164. The situation is as shown in FIG. 7.

Other techniques for removing material may be used, such as dry or single-sided wet etching, either alone or in combination with grinding, to remove about 400 µm of silicon from a 500 µm thick substrate, leaving about 100 µm of material as substrate 100. The etching can be done either before, but typically after the via substrate 100 is bonded to a device substrate. Accordingly, using the methods described here, through wafer vias of diameter less than about 50 µm and depths of at least about 100 µm may be made. More particularly, the aspect ratio of the via, that is, the ratio of the depth of the via to its width, may be at least one-to-one, and up to and beyond 15 or 20-to-1.

Accordingly, a conductive path now exists between one surface of the semiconductor substrate 100 and the obverse surface of the semiconductor substrate 100, such that through substrate via now exists in semiconductor substrate 100. However, there may no longer be a conductive path between the through wafer vias, as the plated material 180 and conductive seed layer 160 has been removed, such that the vias 122 and 124 may be substantially electrically isolated from one another.

Although not shown in FIG. 7, it should be understood that a conductive pad may be formed on the top, as well as on the bottom of the through substrate vias 162, 164. These pads may serve to assist in providing electrical connections to the vias 162 and 164 and to protect them from environmental degradation. The pads are described in greater detail in the next embodiment described below.

Figure 8:
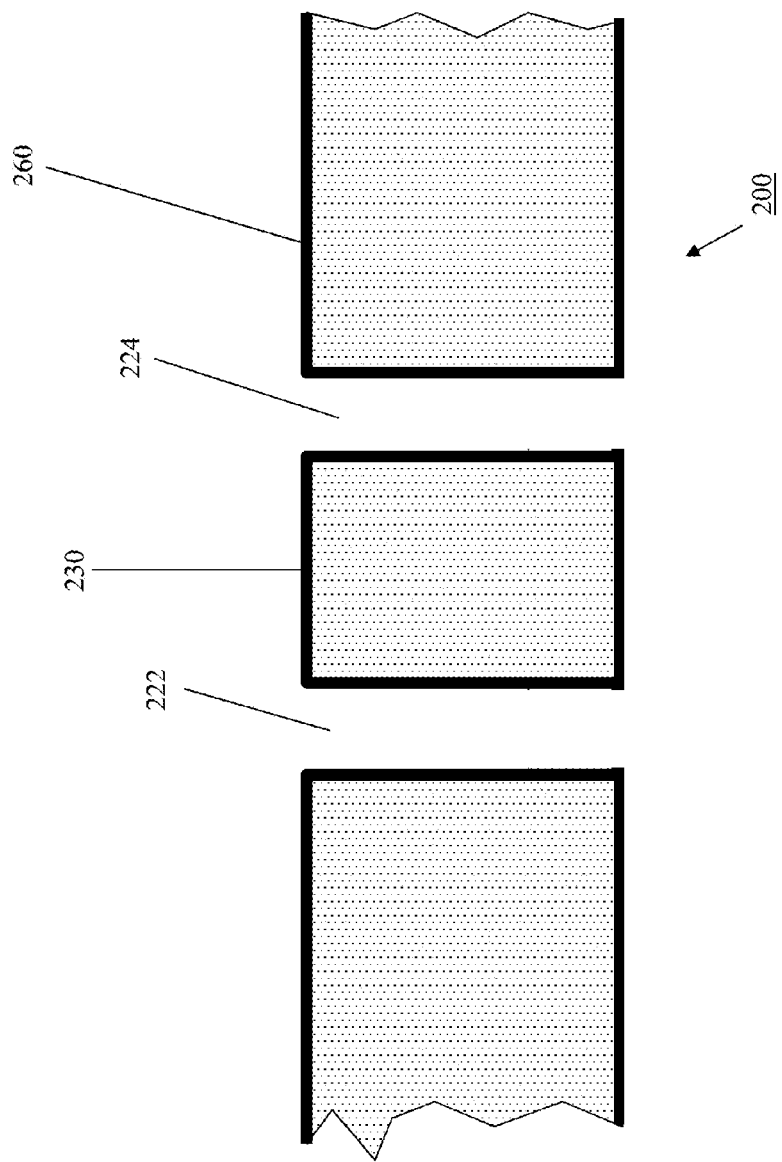
FIG. 8 is a schematic cross sectional diagram of a second embodiment of forming vias in substrate wherein through holes in the substrate are doped.

FIG. 8 is a cross sectional diagram of a second TSV process. In this second process through holes are made in a semiconductor substrate 200. In this embodiment, the via holes 222 and 224 extend through the entire thickness of the substrate so no back grinding will be needed to reveal the conductive material deposited in the hole. As before, the surface layer 260 of the substrate may be more highly doped than the interior, such that the surface layer may function as a seed layer for the plating process. Accordingly, the substrate 200 may be doped after formation of the through holes 222 and 224.

Figure 9:
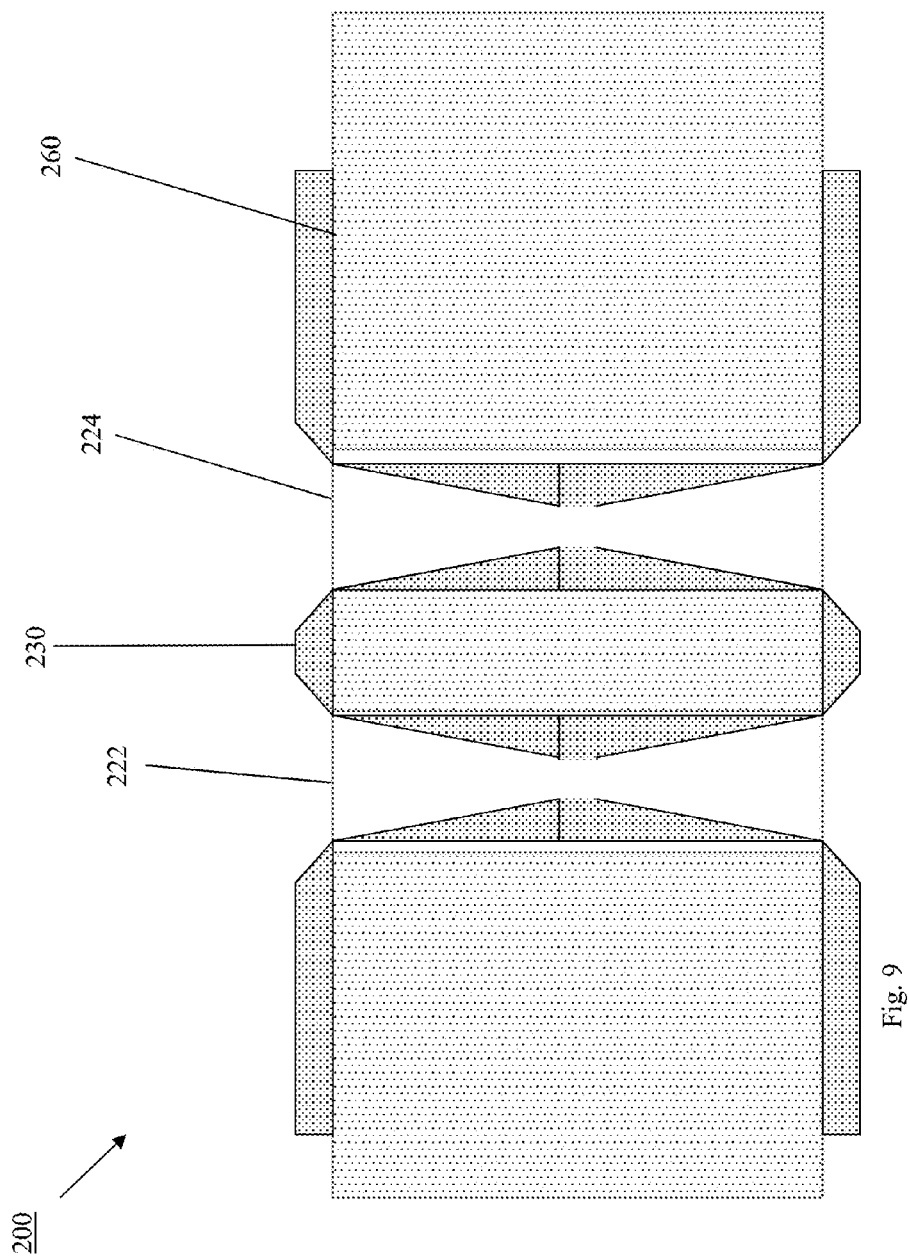
FIG. 9 is a schematic cross sectional diagram of the second embodiment wherein the through holes are plated.

As shown in FIG. 9, by coupling an electrode to the surface layer 260 of the doped semiconductor substrate 200, the conductive metal suspended in the plating solution may be deposited on the surface layer 260 as material 280. This process may continue until the via holes 222 and 224 are entirely filled with the conductive material 262 and 264. If material 262 and 264 is deposited proud of the surface of the substrate 200, it may be polished as before, using, for example, chemical mechanical polishing (CMP), as in the first embodiment, on both the frontside and the backside. In particular, the plating may proceed to a point at which the plating material 280 is deposited in and beyond the holes 222 and 224. Therefore, the plating process may result in a non-planar top and bottom surface profile 280, which can be planarized using any known technique, such as chemical mechanical planarization (CMP). The CMP process may stop on the original substrate, such as Si, and therefore the CMP process may also remove the plating surface layer 260.

Figure 10:
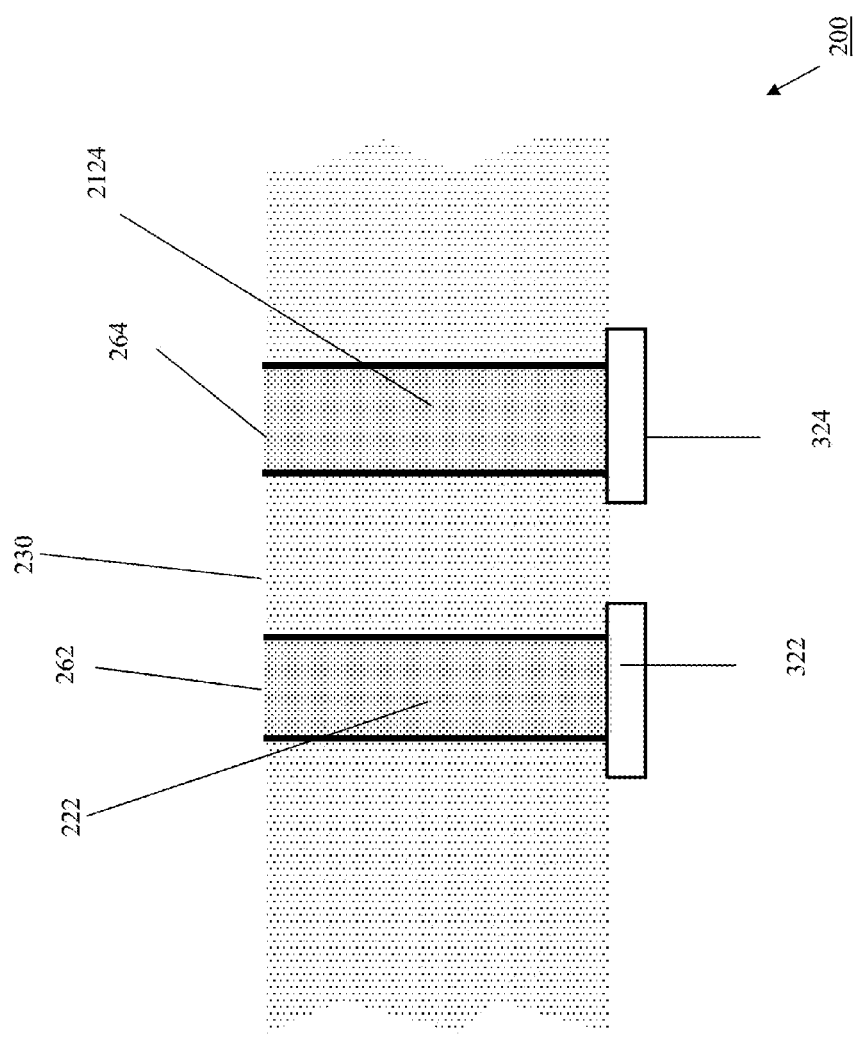
FIG. 10 is a schematic cross sectional diagram of the finished substrate with through substrate vias in the doped material and with bonding pads.

FIG. 10 is a cross sectional view of the exemplary substrate 200 after completion of the second TSV process. The substrate 100 or 200, now called the "via substrate" may now be applied for use in conjunction with a MEMS device. At this point, there may be no conductive path between the through wafer vias 222 and 224, as the plated material 262 within the through wafer via 222 may be electrically isolated from the plated material 280 within every other via 224 by the substrate material.

As shown in FIG. 10, the through substrate vias 262 and 264 may be covered with a conductive pad, 322, 324 respectively. The structure and formation of such pads is described below with respect to FIG. 11.

The via substrate 100 or 200 may, at this point, be used to fabricate a MEMS or an integrated circuit device on its surface. Alternatively, a MEMS or IC device may have been previously fabricated on another substrate, which may be either Si, or an SOI substrate, for example, and bonded to the via substrate 100, 200. The bonding mechanism may be, for example, eutectic, glass frit, polymer, or another other low-temperature bonding method, typically less than 300 degrees centigrade. The MEMS device may also be made first on top of the via substrate 100 or 200, then bonded to a lid wafer, also with a relatively low temperature process, such as eutectic bonding or glass frit bonding. Because there are metals on the via substrate, high temperature bonding may not be used. Additional details describing the formation of the MEMS device are set forth below, in reference to FIG. 11, which depicts an application using the through substrate vias (TSVs) on the doped substrate to form a device.

Figure 11:
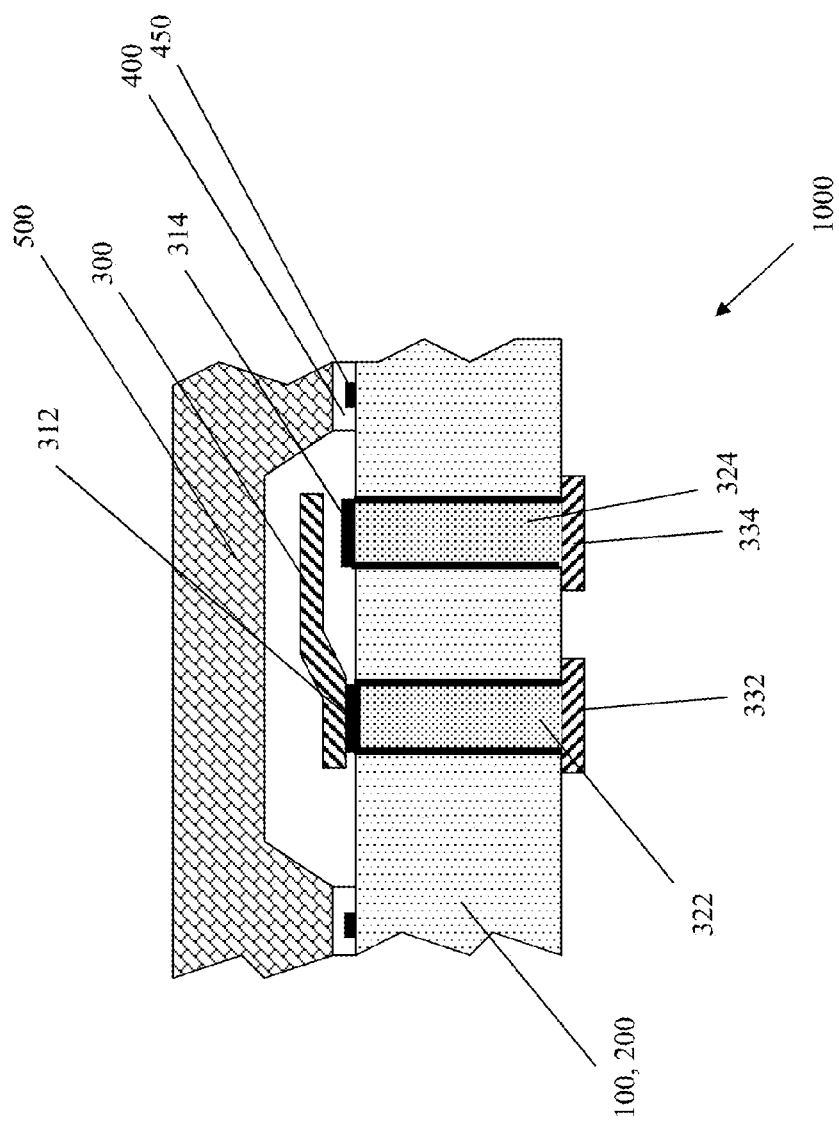
FIG. 11 is a schematic cross sectional diagram of the finished substrate with through substrate vias and a MEMS device encapsulated thereon.

FIG. 11 shows an exemplary finished MEMS package 1000, sealed with a hermetic lid 500 and with the substrate 100, 200 having through wafer vias 322 and 324 formed therein. The MEMS package 1000 may comprise an electrostatic switch or relay having a cantilevered device 300, which when the switch is activated, may touch a set of bottom contacts 332 and 334 to close a circuit. It should be understood that the device shown in FIG. 11 is exemplary only, and that the concepts described here may be applied to a wide variety of MEMS or IC devices. Here, a simple cantilevered device 300 may be fabricated on the via substrate 100 by first plating a sacrificial copper layer, then plating gold contacts over the sacrificial layer, and/or on the via substrate 100. A cantilevered nickel beam may then also be plated over the sacrificial copper layer. Finally, after removing the sacrificial copper layer, the nickel beam with gold contacts is free to bend about its anchor point. U.S. patent application Ser. No. 11/263,912, incorporated by reference in its entirety, sets forth further details of the formation of a nickel cantilevered thermal MEMS switch which may be formed over a via substrate 100.

Alternatively, the MEMS device 300 may be made by forming moveable features in the device layer of another SOI wafer by, for example, deep reactive ion etching (DRIE) with the oxide layer forming a convenient etch stop. The movable feature is then freed by, for example, wet etching the oxide layer from beneath the moveable feature. The device layer may then be bonded face to face with a via substrate 100, 200. The inner surface of the via substrate may be an integral part of the MEMS device, for example, switch contacts may be placed directly over the vias. Additional details as to the method of manufacture of such a cantilevered MEMS switch may be found in U.S. patent application Ser. No. 11/211,623, U.S. patent application Ser. No. 11/211,624 and U.S. patent application Ser. No. 11/359, 558. Additionally, the through wafer via may be part of the lid wafer, carrying signals to the MEMS device through a connection in the bond line, while not actually being an active part of the device.

However, it should be understood that the MEMS device 300 may be any of a number of devices other than the switches described in the incorporated '912 application, '623 application, '558 application, or '624 application. Other exemplary devices may include accelerometers, sensors, actuators, and the like. Since the details of the MEMS device 300 are not necessary to the understanding of the systems and methods described here, it is depicted only schematically in FIG. 11. Similarly, the systems and methods disclosed here may also be applied to passive MEMS or non-MEMS devices, such as integrated circuits using the through wafer via substrate 100 or 200.

The through wafer vias 322 and 324 may be made using the plating onto a doped substrate process described above, to form a low-cost, highly conductive via with excellent thermal conductivity. However, the ability of the plated via to form a hermetic seal from one side of the wafer to the other may be limited by such factors as grain boundaries, and the propensity of the plated metal to crack and delaminate from the surrounding substrate, especially at elevated temperatures. A more hermetic seal may be made by providing thin pads 332 and 334 over the through wafer vias 322 and 324, as shown in FIG. 11. The pads 332 and 334 may be conductive, and may be formed from, for example, gold (Au) and additional functional layers.

For example, the pads 332 and 334 may be formed before the MEMS device 300, by first depositing an adhesion layer such as chromium (Cr), followed by a layer of Au. A barrier layer, for example, molybdenum (Mo) may also be used to prevent the chromium of the adhesion layer from diffusing into the gold of the pad. The thickness of the pads 332 and 334 may be sufficient to provide a barrier to the transmission of gasses through the pad and therefore through the via, and therefore may increase the hermeticity of the encapsulated MEMS device 300. A thickness of between about 2500 Angstroms and about 1 μm of gold may be sufficient to provide this barrier. The Cr adhesion layer may be between about 50 Angstroms and about 1500 Angstroms thick, and the optional Mo layer may be about 100 Angstroms thick. These materials and layers may be sputter deposited, for example. Also, pads may be placed on the outer surface of the substrate, as probe pads 322 and 324, which in addition to providing a hermetic seal, allow the encapsulated device to be probed electrically from outside the encapsulation.

The gold pads 332 and 334 may be formed so that the edges extend slightly beyond the vias, about 5 μm beyond is typically sufficient to allow a misalignment tolerance and a good seal. The gold pad 332 and 334 can be formed using a lift-off process, or deposited, patterned and etched using dry or wet processes, applied to the multilayers described above.

In one embodiment, copper is used as the conductive material and may be electroplated as described above. In addition to providing a barrier to the transmission of gasses, the pads 332 and 334 may also serve to keep the copper vias 322 and 324 from oxidizing during processing. Pad 334 may also be used as a switch contact as shown in FIG. 11.

After formation of the gold pads 332 and 334, and formation of the MEMS device 300, the MEMS cantilevered device 300 may be encapsulated in a cap or lid wafer 500, which has been relieved in areas to provide clearance for the movement of MEMS device 300. A hermetic seal may be made using any suitable adhesive 400, which may be applied to the bonding surfaces of the lid wafer 500. For example, the hermetic seal may be an alloy seal as taught in greater detail in U.S. patent application Ser. No. 11/211,625 and U.S. patent application Ser. No. 11/211,622 incorporated by reference herein in their entireties. The alloy seal may be an alloy of gold (Au) layers and indium (In) layer, in the stoichiometry of $AuIn_2$. The bond line 400 may have a raised feature 450 formed therein, which may assist in the bonding as described in U.S. Pat. No. 7,569,926, incorporated by reference in its entirety. Alternatively, the hermetic seal may be formed using a glass frit with embedded particles as a standoff, as taught in U.S. patent application Ser. No. 11/390,085, incorporated by reference herein in its entirety.

Electrical contact to the encapsulated MEMS cantilevered device 1000 may be obtained with the through wafer vias 322 and 324. Contacts may be made by depositing a layer of a conductive material 332 and 334, onto the back side of substrate 100 or 200. The conductive material 332 and 334 may be, for example, gold pads about 0.5 μm or greater in thickness. As previously mentioned, these contacts 322 and 324 may serve as probe pads for testing the functionality of the encapsulated device 1000.

Figure 12:
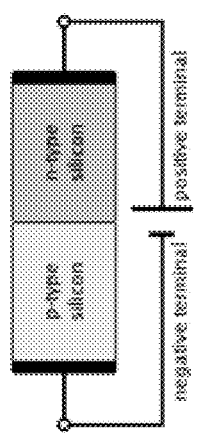
FIG. 12 is an illustration of a reverse biasing scheme.

Because of the approach used here to dope the semiconductor wafer in order for the surface to act as a seed layer, the doped layer may form a type of pn transistor junction with respect to the bulk semiconductor material. Thus, it may be important to establish a reverse voltage bias across the p-n junction formed by the doped layer and the bulk semiconductor. If the doping results in the formation of a p-type layer, such as is the case using boron (B) or phosphorous (P), this layer may be maintained at a negative potential with respect to the bulk material. If the layers are forward biased instead, significant leakage current may exist between the vias 322 and 324. A suitable biasing scheme is illustrated in FIG. 12, which may be found in Saumitra R Mehrotra & Gerhard Klimeck, CC BY 3.0, https://commons.wikimedia.org/w/index.php?curid=10278121.

Figure 13:
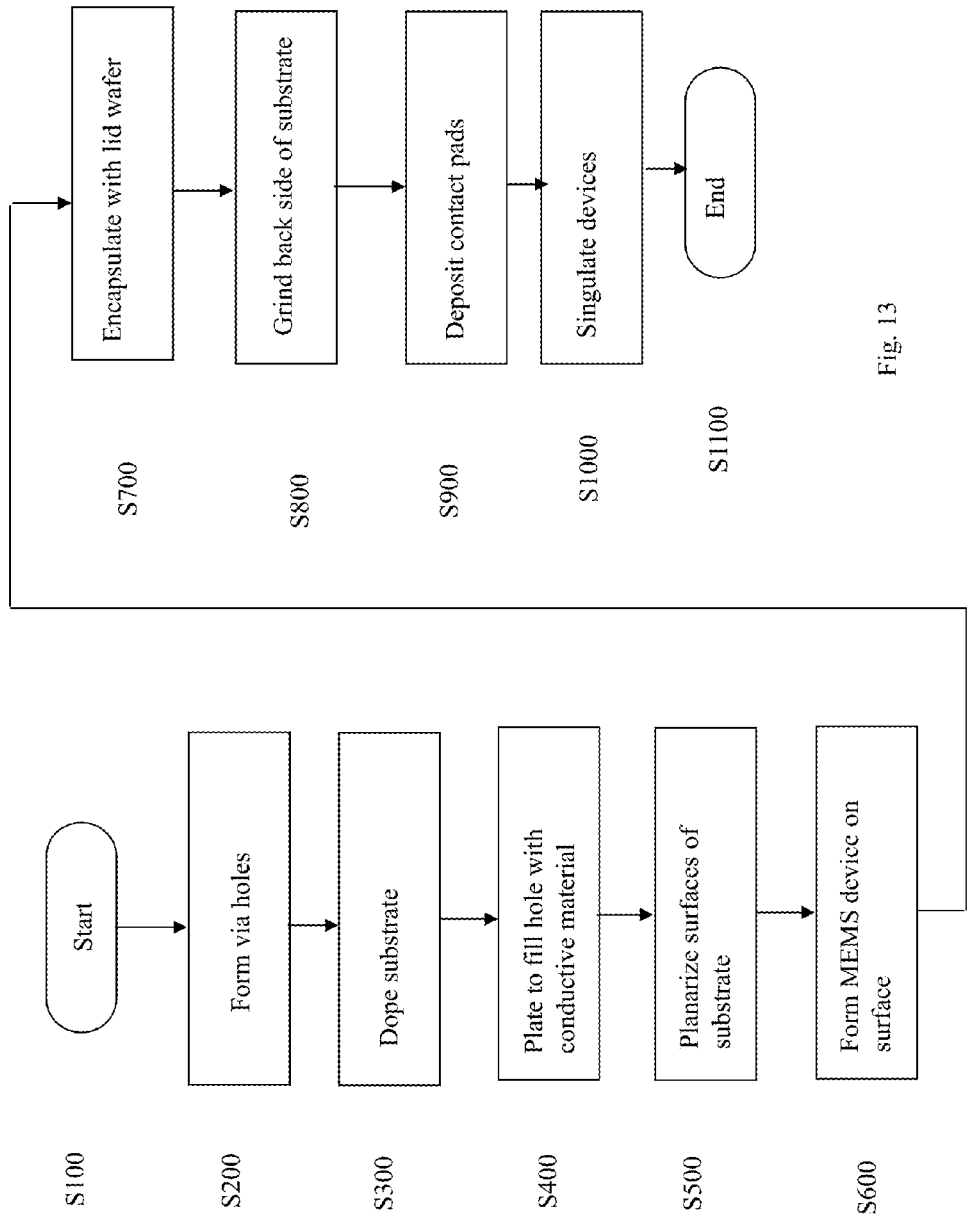
FIG. 13 is an exemplary flowchart describing a method for making vias with a doped substrate.

FIG. 13 is an exemplary flow chart describing a method for manufacturing an encapsulated device with through wafer vias formed in a doped semiconductor substrate. The method begins in step S100 and proceeds to step S200, wherein a plurality of holes is formed in the substrate. In step S300, the substrate is doped. In step S400, the holes are plated with a conductive material. In step S500, the plated blind trenches are polished to planarize the surface of the substrate. The substrate may be planarized using, for example, chemical mechanical planarization. In step S600, the MEMS device may be fabricated on the front side of the through wafer via substrate. In various exemplary embodiments, the MEMS device may be a cantilevered electrostatic switch, for example. In step S700, the MEMS devices are encapsulated with a lid wafer hermetically sealed to the device wafer supporting the MEMS devices.

In step S800, material may be removed from the back side of the substrate to remove the dead end wall of the blind trench to form the through wafer vias. In various exemplary embodiments, the back side of the substrate may be ground or etched to remove the dead end wall of the blind trench.

The process may continue in step S900, wherein the contact probe pads may be deposited over the through wafer vias on the back side of the substrate. In step S1000, the devices may be singulated from the device wafer by, for example, saw cutting. The process may end in step S1100.

It should be understood that not all of the steps of the method illustrated in FIG. 13 may be required, and that the steps need not be performed in the order shown. For example, if an IC is being fabricated rather than a MEMS device, the lid wafer may not be necessary. In addition, the devices need not be singulated in step S1000. It should also be understood that additional dielectric layers may be added to the sequence, for example, between the etching of the vias holes in step S300 and the grinding of the substrate in step S800 and the deposition of the contact pads in step S900, to provide enhanced signal isolation between vias and pads, beyond what the resistivity of the substrate provides.

Accordingly, disclosed is a method for forming at least one through substrate via in a semiconductor substrate, the method including forming at least one hole in the frontside of the semiconductor substrate, doping the substrate until a resistivity of less than about 20 ohm-cm is reached on a wall of at least one hole formed in the semiconductor substrate, filling the at least one hole with a conductive material, by depositing material on to the doped wall of the at least one hole. The method may further include removing a backside of the semiconductor substrate to reveal the conductive material in the hole, and the semiconductor substrate may be a high resistivity silicon substrate of resistivity>1000 ohm-cm.

The method may further comprise applying a DC bias to the conductive material such that the conductive material is reverse-biased with respect to the semiconductor substrate. The method may further comprise planarizing the semiconductor substrate to make the conductive material substantially flush with the semiconductor substrate. Removing the backside may comprise at least one of etching and grinding. Filling the hole with conductive material may comprise at least one of electroplating the conductive material and electroless plating of the conductive material. Forming the at least one hole may comprise forming at least one of a through hole and a blind hole in the substrate.

The method may further comprise forming at least one of a MEMS device and an integrated circuit (IC) device on the semiconductor substrate, wherein the at least one of the MEMS device and an integrated circuit (IC) device is electrically coupled to the at least one through substrate via. Doping the substrate may comprise implanting at least one of boron, phosphorous or arsenic ions by heating.

Accordingly, a semiconductor substrate is disclosed, with vias formed through a thickness of the substrate. The semiconductor substrate may comprise at least one through hole formed through the thickness of the semiconductor substrate, a doped surface layer at least about 0.1 microns thick, and doped with a dopant, the surface layer having a resistivity of less than about 20 ohm-cm, and more preferably less than about 8 ohm-cm, and a conductive material in the at least one through hole. The semiconductor substrate may further comprise at least one MEMS device formed on the semiconductor substrate and electrically coupled to the conductive material. It may also comprise a lid wafer with a device cavity formed therein, and bonded to the semiconductor substrate with an adhesive bonding material to hermetically seal the MEMS device in the device cavity. The adhesive bonding material for the lid wafer may comprise at least one of a metal, a metal alloy, and glass frit.

The semiconductor substrate may further comprise at least one bonding pad electrically coupled to the conductive material, allowing electrical access to the MEMS device encapsulated inside the device cavity. The conductive material may be at least one of gold, copper, aluminum and nickel, and the dopant may comprises at least one of boron, phosphorous, antimony or arsenic ions.

The aforementioned MEMS device may include an electrostatically actuated cantilevered switch. The semiconductor substrate may alternatively include at least one integrated circuit (IC) device formed on the semiconductor substrate and electrically coupled to the at least one via. The at least one through substrate via has an aspect ratio of between about 10 and about 30.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes an embodiment including a MEMS switch, it should be understood that this embodiment is exemplary only, and that the systems and methods disclosed here may be applied to any number of alternative MEMS or non-MEMS devices. Accordingly, the exemplary implementations set forth above, are intended to be illustrative, not limiting.

What is claimed is:

1. A semiconductor substrate with vias formed through a thickness of the substrate, comprising:
   at least one through hole formed through the thickness of the semiconductor substrate;
   a doped surface layer in the wall of the hole, wherein the doped surface layer is at least about 0.1 microns thick, and doped with a dopant, the surface layer having a resistivity of at least about 20 ohm-cm, and
   a conductive material in the at least one through hole.

2. The semiconductor substrate of claim 1, further comprising:
   at least one MEMS device formed on the semiconductor substrate and electrically coupled to the conductive material.

3. The semiconductor substrate of claim 1, further comprising:
   a lid wafer with a device cavity formed therein, and bonded to the semiconductor substrate with an adhesive bonding material to hermetically seal the MEMS device in the device cavity.

4. The semiconductor substrate of claim 3, further comprising:
   at least one bonding pad electrically coupled to the conductive material, allowing electrical access to the MEMS device encapsulated inside the device cavity.

5. The semiconductor substrate of claim 4, wherein the conductive material is at least one of gold, copper, aluminum and nickel, and wherein the semiconductor substrate is high resistivity Si substrate of resistivity>1000 ohm-cm.

6. The semiconductor substrate of claim 1, wherein the dopant comprises at least one of boron, phosphorous, antimony or arsenic ions.

7. The semiconductor substrate of claim 2, wherein the MEMS device comprises and electrostatically actuated cantilevered switch.

8. The semiconductor substrate of claim 1, further comprising:
  at least one integrated circuit (IC) device formed on the semiconductor substrate and electrically coupled to the at least one via.

9. The semiconductor substrate of claim 2, wherein the adhesive bonding material comprises at least one of a metal, a metal alloy, and glass frit.

10. The semiconductor substrate of claim 2, wherein the at least one through substrate via has an aspect ratio of between about 10 and about 30.

* * * * *